(12) United States Patent
Summerland et al.

(10) Patent No.: US 12,278,264 B2
(45) Date of Patent: Apr. 15, 2025

(54) SEMICONDUCTOR STRUCTURE AND METHOD FOR GUARDING A LOW VOLTAGE SURFACE REGION FROM A HIGH VOLTAGE SURFACE REGION

(71) Applicant: Search For The Next, LTD, Nottingham (GB)

(72) Inventors: David Summerland, Nottingham (GB); Roger Light, Nottingham (GB); Luke Knight, Nottingham (GB)

(*) Notice: Subject to any disclaimer, the term of this patent is extended or adjusted under 35 U.S.C. 154(b) by 0 days.

(21) Appl. No.: 17/760,048

(22) PCT Filed: Feb. 4, 2021

(86) PCT No.: PCT/GB2021/050250
§ 371 (c)(1),
(2) Date: Aug. 3, 2022

(87) PCT Pub. No.: WO2021/156620
PCT Pub. Date: Aug. 12, 2021

(65) Prior Publication Data
US 2023/0062444 A1    Mar. 2, 2023

(30) Foreign Application Priority Data
Feb. 4, 2020 (GB) .................. 2001477

(51) Int. Cl.
*H01L 29/06* (2006.01)
*H01L 29/732* (2006.01)

(52) U.S. Cl.
CPC ........ *H01L 29/0646* (2013.01); *H01L 29/732* (2013.01)

(58) Field of Classification Search
CPC ............. H01L 29/0646; H01L 29/0649; H01L 29/732; H01L 29/0619–0623;
(Continued)

(56) References Cited

U.S. PATENT DOCUMENTS 10,510,747 B1    12/2019  Qiao et al.
11,373,994 B2 *   6/2022  Boufnichel ....... H01L 21/76224
(Continued)

FOREIGN PATENT DOCUMENTS

FR    3101480 A1 *  4/2021  ....... H01L 21/76224

*Primary Examiner* — Natalia A Gondarenko
(74) *Attorney, Agent, or Firm* — Jose Gutman; Fleit Intellectual Property Law (57) ABSTRACT

A structure and method for guarding a high voltage region at a semiconductor surface from a low voltage region at the semiconductor surface. The structure comprising at least two trenches between the high and low voltage regions to isolate the high voltage region from the low voltage region. The trenches are spaced apart so as to define a sub-region therebetween. To prevent breakdown across the trenches, an intermediate voltage, i.e., of a value between the voltages of the high and low voltage regions, is applied to the sub-region so as to reduce the voltage drop across each trench. Preferably this is achieved by providing an integrated voltage divider circuit that connects between the high and low voltage regions and has an output connected to the sub-region by which the intermediate voltage is applied to the sub-region.

17 Claims, 6 Drawing Sheets

(58) Field of Classification Search
CPC ............. H01L 29/7811; H01L 29/7823; H01L 29/866; H01L 27/0255; H01L 27/0248; H01L 27/0623–0635; H01L 27/0647; H01L 27/0652; H01L 27/0664–0676; H01L 21/76224; H01L 21/76281–76291; H01L 21/76267–76278; H01L 25/03; H01L 25/04; H01L 25/065; H01L 25/0652; H01L 25/0655; H01L 27/0711–0727; H01L 27/075–0766; H01L 27/0783; H01L 27/0266; H01L 27/0259
USPC ....... 257/183, 124, 274, 173, 146, 112, 607; 438/218, 510
See application file for complete search history.

(56) References Cited

U.S. PATENT DOCUMENTS

| | | |
|---|---|---|
| 2011/0062547 A1 | 3/2011 | Onishi et al. |
| 2015/0084162 A1* | 3/2015 | Davis ................. H01L 29/8611 438/510 |
| 2015/0123240 A1 | 5/2015 | Bowman et al. |
| 2015/0294965 A1 | 10/2015 | Strijker et al. |
| 2015/0333132 A1* | 11/2015 | Yeh ................... H01L 29/66143 257/488 |
| 2015/0349055 A1 | 12/2015 | Tokumitsu |

* cited by examiner

SEMICONDUCTOR STRUCTURE AND METHOD FOR GUARDING A LOW VOLTAGE SURFACE REGION FROM A HIGH VOLTAGE SURFACE REGION

CROSS-REFERENCE TO RELATED APPLICATIONS

This application claims priority from and is related to the following prior application Patent Cooperation Treaty Patent PCT/GB2021/050250, filed on Feb. 4, 2021, which claims priority from Great Britain Patent Application No. 2001477.5, filed on Feb. 4, 2020. These prior applications, including the entirety of their written description and drawings, are collectively hereby incorporated by reference into the present application.

BACKGROUND

The present invention relates to semiconductor device comprising a guard structure for guarding a high voltage region at a semiconductor surface from a low voltage region at the semiconductor surface.

Figure 1:
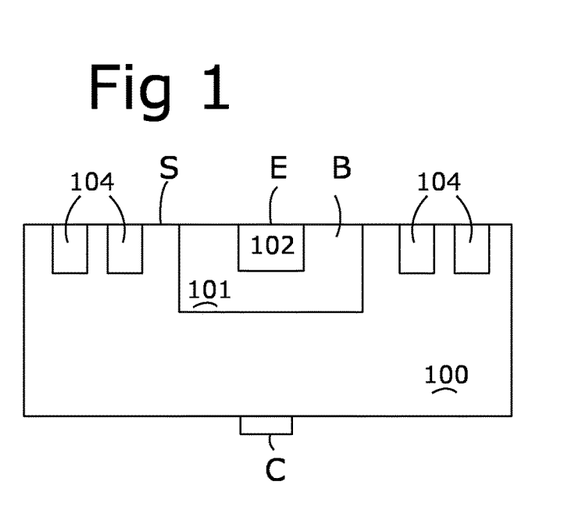
FIG. 1 is a schematic of a semiconductor layer structure of a prior art high power bipolar diode device incorporating a guard ring structure.

FIG. 1 illustrates a prior art semiconductor layer structure that provides an integrated circuit including a vertical bipolar transistor device.

The transistor device is formed on a chip comprised from p-type semiconductor 100 in which an n-type region 101 is formed through doping to provide the base region of the transistor. A p-type region 102 is formed in the n-type region to provide a collector of the transistor. The collector terminal is provided on the base of the chip.

Deformities at the edges of the chip encourages voltage at the collector terminal to travel up the sides of the chip. Where the voltage between the emitter and collector is large, e.g., 600V, breakdown can occur across surface S.

To prevent this, it is common to implement a guard ring structure comprised from nested rings 104 of N-type region between the n-type region 101 and the edge of the chip. The spacing between the rings 104 is selected to provide the necessary size depletion region to prevent breakdown across the diode junctions formed between the n-type rings 104 and p-type region 102.

Figure 2:
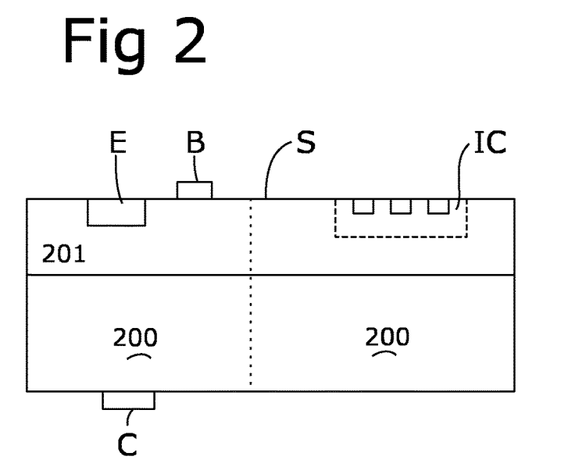
FIG. 2 is a schematic of a variant prior art semiconductor layer structure to provide a high-power bipolar diode and low power integrated circuitry.

FIG. 2 illustrates a prior art semiconductor structure for forming a vertical bipolar junction transistor and low voltage integrated circuitry IC. The layer structure is formed by depositing, by epitaxy, a semiconductor layer 201 of a first type on top of a substrate 200 of a second type, in this example a p-type layer, on an n-type wafer.

A first portion of the p-type layer 201 provides the base region of the vertical bipolar junction transistor. Another portion of the p-type layer 201 provides a substrate in which the electronic components of the integrated circuitry IC are formed.

The use of epitaxy provides a well-defined junction between the two semiconductor layers 200, 201 and is a far faster method of forming the structure compared with forming the p-type layer 201 through doping the substrate.

Similarly, to the structure of FIG. 1, it is possible for the high voltage applied at the bottom of the chip to travel up to the chip surface S.

It is therefore necessary to isolate the high voltage of the collector from both the emitter and the IC.

The guard ring structure of FIG. 1 is not compatible with the structure of FIG. 2 as current would leak through the p-type layer 201 below the rings.

An alternative means of isolation is to form a ring-shaped trench through the p-type epitaxial layer 201, the trench extending from the surface of the wafer through to the n-type wafer 200. This method is not effective where there is a large voltage difference between the high and low voltage regions as breakdown across the trench can occur.

BRIEF SUMMARY

The present invention was devised to provide a more effective means of isolating a high voltage area from a low voltage area on the surface of a semiconductor chip which includes the bi-layered structure of FIG. 2.

According to a first aspect of the invention there is provided a semiconductor device comprising a guard structure for guarding a high voltage region at a semiconductor surface from a low voltage region at the semiconductor surface; the guard structure comprising: a first layer of a first type of semiconductor in contact with a second layer of a second type of semiconductor; the second layer providing the semiconductor surface; a first trench and a second trench lying between the high and low voltage regions to isolate the high voltage region from the low voltage region; each of the first and second trenches extending from the semiconductor surface through the second layer (and optionally into the first layer) to define there between a sub-region of the second layer between the high and low voltage regions that is isolated from the high and low voltage regions; and the semiconductor device comprising means for applying an intermediary voltage to the sub-region of the second layer; the intermediary voltage having a value between the voltages of the respective high and low voltage regions.

According to a second aspect of the invention there is provided a method for guarding a high voltage region at a semiconductor surface from a low voltage region at the semiconductor surface; the method comprising: providing a guard structure comprising: a first layer of a first type of semiconductor in contact with a second layer of a second type of semiconductor; the second layer providing the semiconductor surface; a first trench and a second trench lying between the high and low voltage regions to isolate the high voltage region from the low voltage region; each of the first and second trenches extending from the semiconductor surface through the second layer to define there between a sub-region of the second layer between the high and low voltage regions that is isolated from the high and low voltage regions; and applying an intermediary voltage to the sub-region of the second layer; the intermediary voltage having a value between the voltages of the respective high and low voltage regions.

The following applies to either aspect of the invention.

By providing the intermediate voltage at the sub-region the voltage drop between the high voltage region and low voltage region is split across the two trenches, i.e., such that the voltage drop across each trench is less and thus breakdown across either trench can be avoided.

In contrast, the use of multiple trenches without applying an intermediate voltage, as described in relation to FIG. 2, is ineffective at guarding against large voltages as the sub-region adopts a floating state and so no depletion region exists about the diode junction formed between the sub region and first layer below it. As such the high voltage is seen at the surface of the sub region and consequently breakdown occurs across the trench between the sub region and the low voltage region.

The invention was conceived for use in devices in which the difference between the high voltage region and low voltage region was in the 100s of volts. Nevertheless, the invention can be used to guard against any voltage drop. Notwithstanding, it is anticipated that the added complexity of including the guard structure of the invention means that it is primarily of benefit where the voltage between the high and low region is greater than can be guarded against by a single trench. Depending upon the width of the trench this may be, for example, about 30V and greater.

To ensure that the first and second trench extend entirely through the second layer, the first and second trenches may extend into the first layer.

There are number of ways in which the intermediate voltage may be applied. For example, the device may comprise an external (to the chip) voltage source connected to the sub-region. However favorably the device comprises a circuit, more favorably an integrated circuit (favorably formed at least part in the second layer and optionally at least in part in the sub-region), that connects between the high voltage region and the low voltage region; the circuit generates the intermediate voltage; and the circuit comprising an output connected to the sub-region for applying the intermediate voltage to the sub-region.

The circuit may function as a voltage divider having an output connected to the sub-region, the circuit comprising electrical components (e.g., comprised of semiconductor material) over which the high voltage is dropped. One or more of the electrical components may lie, more favorably formed, in the high and/or low voltage region. One or more electrical components may lie, more favorably formed, in the sub-region.

The circuit may comprise a chain of electrical components in series that provide a series of voltage drops and that the output is connected between electrical components of the chain. In this way the voltage can be dropped over multiple electrical components increasing the overall voltage that can be guarded against.

The chain of electric components may include multiple in series electrical components on each side of the output. This allows for a voltage drop across each trench that is greater than can be dropped across a single electrical component.

The chain of electrical components may be physically orientated to run alongside (e.g., the chain extends parallel to) to one or both of the first and second trenches. This reduces the lateral space taken up by the guard structure and where the chain is arranged in the sub-region, allows the lateral spacing between the trenches to be reduced.

The electrical component may comprise a diode. Where the circuit comprises a chain of electrical components the circuit may comprise a chain of diodes. Favorably at least some of the diodes are arranged, when in operation, to be in a reversed biased configuration. This allows a larger voltage to be dropped over each diode reducing the number of diodes required in the chain.

It is favourable that the reverse biased diodes are 'leaky', i.e., allowing a small current through, to avoid substantially all of the voltage being dropped across one diode but rather spread more evenly, e.g., substantively equally, across all of the reverse biased diodes.

In certain embodiments the diode(s) are Zener diodes though in alternative arrangements other types of diodes, e.g., Schottky, could be used.

The semiconductor device may comprise a third trench lying between the high and low voltage regions to isolate the high voltage region from the low voltage region; the third trench extending from the semiconductor surface through the second layer and into the first layer to define between it and the first trench, a second sub-region of the second layer between the high and low voltage regions that is isolated from the high and low voltage regions; and means for applying a second intermediary voltage to the sub-region of the second layer; the second intermediary voltage having a value between the voltages of the intermediate voltage and the high voltage region.

The use of a third trench and a second intermediate voltage further increases the size of voltage that can be guarded against by the structure as it allows, for a given voltage between the high and low voltage regions, a small voltage drop across each trench.

The semiconductor circuit may be arranged to generate the second intermediate voltage; the semiconductor circuit comprising a second output connected to the second sub-region for applying the second intermediate voltage to the second sub-region.

One or more electrical components may lie, more favorably formed, in the second sub-region The chain of electrical components may include multiple in series electrical components on each side of the output.

The circuit may be comprised from one or more diodes integrally formed in the second layer, e.g., one or more diodes in one or more of the sub-region, second sub-region, high voltage region or low voltage region.

The circuit may be comprised from a third layer that lies on the semiconductor surface and extends over the first and second trenches to provide electrical connections between the high voltage region, low voltage region, the one or more electrical component, sub-region and second-sub-region (where present).

The third layer is favorably comprised of a semiconductor of the second type, e.g. doped polysilicon.

The guard structure may comprise an insulating (e.g., oxide) layer arranged between the semiconductor surface and the third layer, the insulating layer defining windows that provide contact regions between the semiconductor surface and the third layer. A number of the windows may be arranged to provide direct contact between the third layer and semiconductor surface in the sub-region to provide the circuit's output to the sub-region.

In one arrangement the semiconductor device may comprise: a region of the first type of semiconductor within the layer of the second type and the third layer is comprised from a layer of a second type of semiconductor, e.g., doped polysilicon, the third layer contacts with the region of the first type of semiconductor to form a diode junction to provide the diode.

Where the region is in the high voltage region, low voltage region or second sub-region (where applicable), the portion of the third layer may extend over the first trench to provide electrical connection between the diode and the sub-region.

In this way the diodes of the circuit can be integrally formed in the second layer.

However, the parts of the third layer, such as those that cross the trench may be comprised from metal traces. Further alternatively metal could be used to contact the region of the first type to provide one or more Schottky diode.

The structure may comprise a further region of the first type of semiconductor within the sub-region of the second layer; and that the portion of the third layer is additionally in contact with the further region of the first type of semiconductor to form a diode within the sub-region and to provide electrical connection between the two diodes across the first trench.

The third layer may include a second portion in contact with the further region of the first type of semiconductor within the sub-region to form a second diode junction to provide a second diode of the circuit, the second portion providing connection to either a further diode within the sub-region or extending over the second trench to provide connection wi.

The trenches may be arranged in a nested formation around the low voltage region or high voltage region.

Where the circuit comprises multiple in series electrical components integrally formed within the sub-region, the maximum voltage that can be dropped within the sub-region is limited by the breakdown voltage of a parasitic diode that is formed between the second layer and the region of the first type of semiconductor formed therein. This leads to the need for many nested sub-regions where a large voltage drop is needed.

By way of a solution the guard structure may include a first set of lateral trenches that extend across the sub-region between the first and second trenches to divide the sub-region into divisions, and wherein the circuit comprises a separate output connected to each division and adapted to apply, through the separate outputs, a different intermediate voltage to each division.

This arrangement allows for the voltage to be stepped down at each division, e.g. through the provision of one or more integrated electrical components within the (optionally each) division and therefore allows for a larger total voltage drop to be achieved for a given number of nested trenches.

Where there are more than two nested trenches—so that there are a second or more sub-regions—each of these may be so subdivided. For example, the guard structure may additionally comprise a second set of lateral trenches that extend across the second sub-region between the first and third trenches to divide the second sub-region into divisions and wherein the circuit comprises a separate output connected to each division of the second sub-region and adapted to apply, through the separate outputs, a different intermediate voltage to each division of the second sub-regions.

The first set of lateral trenches may be offset relative the second set of lateral trenches about the first trench. This allows for improved separation between higher voltage divisions of the second sub-region and lower voltage divisions of the sub-region.

BRIEF DESCRIPTION OF THE DRAWINGS

The accompanying figures in which like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

As required, detailed embodiments are disclosed herein; however, it is to be understood that the disclosed embodiments are merely examples and that the devices and methods described herein can be embodied in various forms. Therefore, specific structural and functional details disclosed herein are not to be interpreted as limiting, but merely as a basis for the claims and as a representative basis for teaching one of ordinary skill in the art to variously employ the disclosed subject matter in virtually any appropriately detailed structure and function. Further, the terms and phrases used herein are not intended to be limiting, but rather, to provide an understandable description. Additionally, unless otherwise specifically expressed or clearly understood from the context of use, a term as used herein describes the singular and/or the plural of that term.

The terms "a" or "an", as used herein, are defined as one or more than one. The term "plurality", as used herein, is defined as two or more than two. The term "another", as used herein, is defined as at least a second or more. The terms "including" and "having," as used herein, are defined as comprising i.e., open language. The term "coupled," as used herein, is defined as "connected," although not necessarily directly, and not necessarily mechanically.

It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Figure 3:
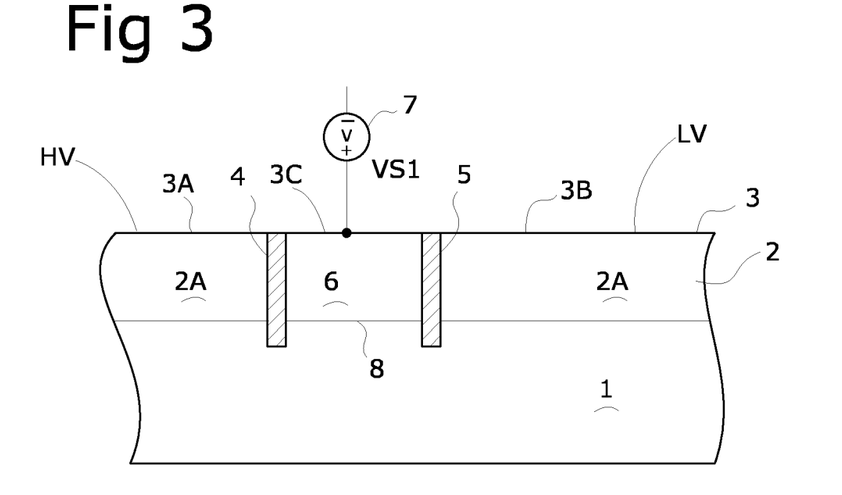
FIG. 3 is a schematic of a guard mechanism including guard structure for a semiconductor device to isolate a high voltage region of the device from a low voltage region of the device.

Referring to FIG. 3 there is illustrated a semiconductor device comprised from a portion of a semiconductor chip having an n-type semiconductor layer 1 on which is deposited, by an epitaxial process, a p-type layer of polysilicon 2 which defines a semiconductor surface 3. The semiconductor surface 3 lies on an opposite side of the p-type layer 2 to the n-type semiconductor layer 1.

The chip is arranged to implement one or more electronic components of the semiconductor device adapted to operate at a relatively low voltage, and one or more electronic components of the semiconductor device adapted to operate at a relatively high voltage. Typically, the chip is arranged to carry an integrated circuit (e.g., logic circuitry) formed in the p-type layer 2 that operates at the relatively low voltage.

In one embodiment, the semiconductor device comprises a vertical high power bipolar transistor and low voltage integrated circuitry arranged to control operation of the vertical high power bipolar transistor.

In the example of the vertical high power bipolar transistor, high voltage may occur at the edges of the surface 3 as a result of leakage from the bottom of the chip.

When the semiconductor device is in operation, a region 2A of the p-layer 2 including a regions 3A of surface 3 is at a relatively high voltage (or fluctuates between relatively high voltages), herein referred to as the high voltage region HV, and another region 2B of the p-type layer 2 including another region 3B of surface 3 is at a relatively low voltage (or fluctuates between relatively low voltages) and is herein referred to as the low voltage region LV. In the present example the high voltage region is at around 30V and the low voltage region at around 0V-5V, however this should in no way be taken as limiting.

Integrated circuitry provided in the low voltage region that operates at relatively low voltages needs protecting from the high voltage.

The semiconductor device comprises two trenches 4, 5 each arranged to isolate the high voltage and low voltage regions HV, LV from one another. Each trench 4, 5 extends from the semiconductor surface 3 through the p-type layer 2 and into the n-type substrate 1 so as to define there-between a sub-region 6 of the p-type layer 2 that includes a further portion 3C of the surface 3. The sub-region 6 including the further portion 3C is isolated from both the high voltage region and the low voltage region by the trenches 4, 5.

In certain embodiments the trenches 4, 5 may be arranged as nested rings enclosing the high or low voltage region HV LV of the semiconductor surface 3 so as to isolate it from the other. In a variant arrangement the sub-region may be defined between two spaced apart trenches that each extend across the surface of the chip from one side of the chip to another.

The semiconductor device further comprises means 7 to apply an intermediate voltage to the sub-region 6. The intermediate voltage has a value between the voltage of the high voltage region HV and voltage of the low voltage region LV.

Through applying the intermediate voltage to the sub-region 6, the voltage across the first trench 4 equals the difference between the voltage at the high voltage region HV and the intermediate voltage, and the voltage across the second trench 5 equals the difference between the voltage at the low voltage region and the intermediate voltage. As such the voltages across each trench 4,5 will be smaller than the difference between the voltages at the high voltage and low voltage regions thereby preventing breakdown across either trench 4, 5.

Further, the application of the intermediate voltage at the sub-region 6 creates a depletion region about a diode junction 8 formed between the n-type substrate 1 and sub-region 6 ensuring that the sub-region 6 does not assume the high voltage value.

Figure 4:
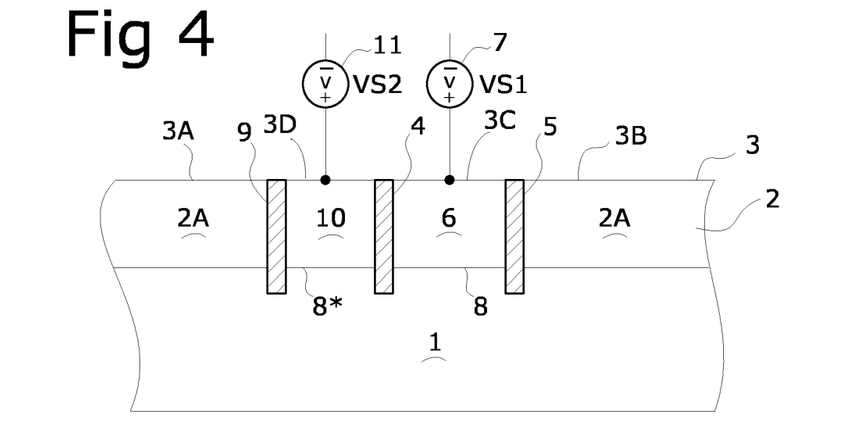
FIG. 4 is a schematic of a variant guard mechanism and structure layer structure to isolate against higher voltages compared with the arrangement of FIG. 3.

FIG. 4 illustrates a variant embodiment comprising a third trench 9 which is also arranged to isolate the high voltage and low voltage regions HV LV from one another. The third trench 9 runs alongside the first trench 4 and extends from the semiconductor surface 3 through the entirety of the p-type layer 2 and into the n-type substrate 1 so as to define between it and the first trench 4, a second sub-region 10 of the p-type layer 2 that includes another portion 3D of the semiconductor surface 3.

The device further comprises means 11 to apply a second, different, intermediate voltage to the second sub-region 10.

In this arrangement, the voltage across the third trench 9 is the difference between the value of the high voltage and the second intermediate voltage, the voltage across the first trench 4 is the difference between the value of the second intermediate voltage and the intermediate voltage, and the voltage across the second trench 5 is the difference between the value of the intermediate voltage and the low voltage.

The application of the second intermediate voltage at the second sub-region 10 creates a depletion region about a diode junction 8* formed between the n-type substrate 1 and second sub-region 10 ensuring that the second sub-region 10 does not assume the high voltage value.

More trenches means that the voltage across each trench 4, 5, 9 for a given voltage between the high voltage region and low voltage region, can be made smaller.

It will be appreciated that this idea can be extended to produce variants that guard against higher voltages by providing a greater number of trenches to provide a greater number of sub-regions, and applying different intermediate voltages of sequential values to the sub-regions based on their separation distance from the low voltage region.

The means to apply the intermediate voltage and second intermediate voltage to the sub-region 6 can take various forms, and thus is shown abstractly in FIGS. 3 and 4 as respective intermediate voltage sources VS1, VS2. For example, the means may comprise one or more voltage sources external to the chip. It may include voltage regulators provided externally or on the chip, having respective outputs connected to the sub-region and second sub-region.

In a preferred implementation the means to apply the intermediate voltage(s) comprises a circuit that electrically connects between the high voltage region HV and low voltage region LV. Example implementations of such a circuit 12 are described with reference to FIGS. 5-10.

In each example the circuit 12 is comprised from a chain of in series Zener diodes 13, arranged, when the circuit 12 is operating, to be reversed biased.

Figure 5:
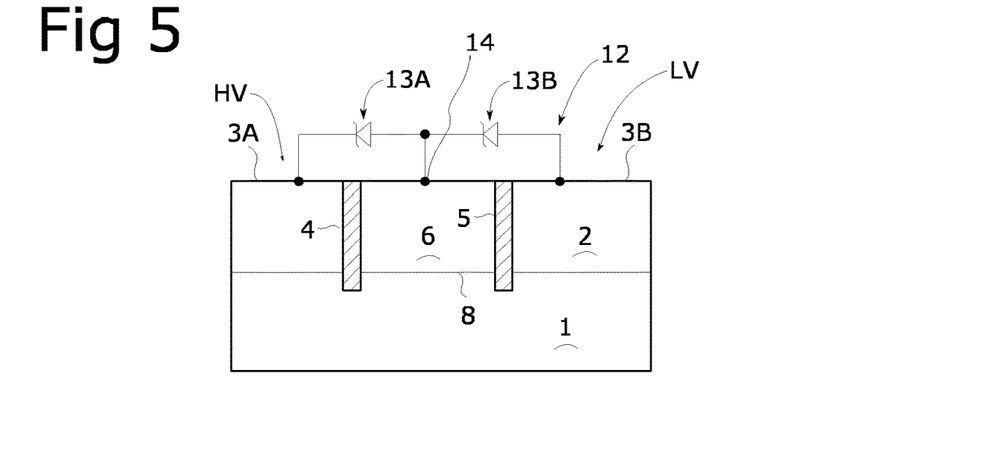
FIG. 5 is a schematic illustrating a circuit to implement the voltage source of FIG. 3.

With reference FIG. 5, which implements the single voltage source of FIG. 3 to apply an intermediate voltage to sub region 6, the circuit 12 comprises two in series Zener diodes 13A, 13B. A first of the diodes 13A is connected to the high voltage region HV and a second of the diodes 13B is connected to the low voltage region LV. The circuit 12 comprises a node 14 between the first and second diodes 13A 13B through which the circuit 12 is connected to the sub-region 6. In this way the voltage of the circuit 12 between the diodes 13A, 13B, i.e., the intermediate voltage, is applied to the sub-region 6. The voltage between the two diodes 13A, 13B will be of a value between the voltage of the high voltage region HV and the low voltage region LV as a result of the voltage dividing property of the circuit 12.

In an embodiment in which the chip provides a high power vertical bipolar junction transistor, such as shown in FIG. 2, the low voltage region LV may be connected to the emitter of the high-power vertical transistor.

Figure 6:
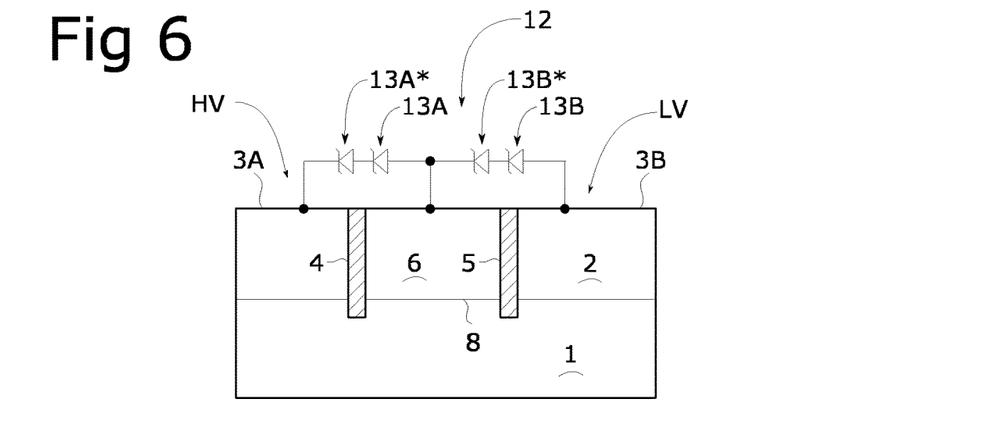
FIG. 6 is a schematic illustrating a variant circuit to implement the voltage source of FIG. 3.

FIG. 6 illustrates a variant embodiment in which the circuit 12 comprises further first and second diodes **13A* 13B* in the chain. First diodes 13A, 13A* are arranged in series between the high voltage region HV and the node 14, and second diodes 13B 13B* are arranged in series between the node 14 and the low voltage region LV. With a greater number of diodes 13 across each trench 4, 5**, the voltage drop across each diode 13 is smaller. This allows for voltage drops across each of the trenches 4, 5 to be greater than the breakdown voltage of a single diode 13. It will be appreciated that this concept can be extended to include any number of additional diodes 13 into the chain.

Figure 7:
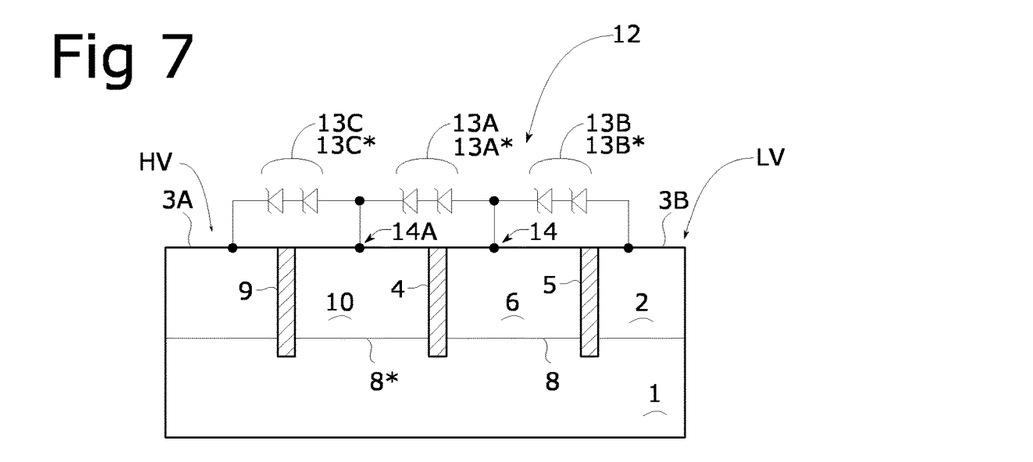
FIG. 7 is a schematic illustrating a circuit to implement the voltage sources of FIG. 4.

FIG. 7 illustrates a variant circuit to implement the embodiment of FIG. 4.

The variant circuit 12 comprises at least one third diode 13C (in this example two are shown 13C, 13C*) arranged between the first diodes 13A 13A* and the circuit's 12 connection to the high voltage region HV, and a further node 14A between the first diodes 13A 13A* and third diode 13C through which the circuit 12 is connected to the second sub-region 10. In this way the second intermediate voltage is applied to the second sub-region 10.

FIGS. 5-7 illustrates embodiments with the same number of diodes arranged across each trench. Although this is the preferred method of implementation it is not essential.

Figure 8:
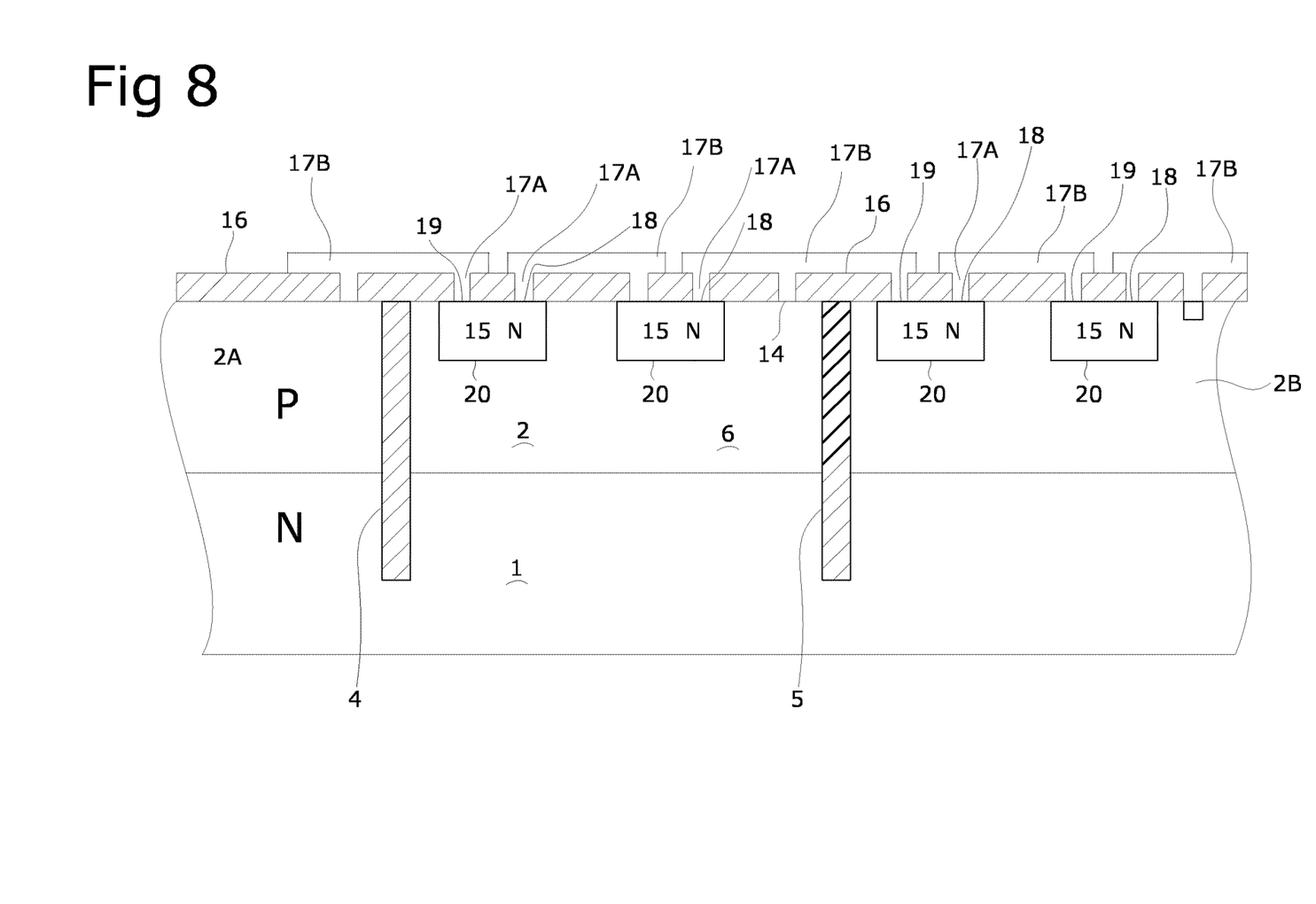
FIG. 8 is a schematic of a semiconductor layer structure used to implement the circuit of FIG. 6.

FIG. 8 is a schematic of a semiconductor layer structure to implement the circuit 12 of FIG. 6.

Within the p-type sub region 6 are provided (e.g., through conventional mask and doping processes) separate n-type diode regions 15; the n-type diode regions are separated by the sub-region 6.

Additional n-type diode regions 15 are also provided in the p-layer 2 within the low voltage region 2B.

Figure 9A:
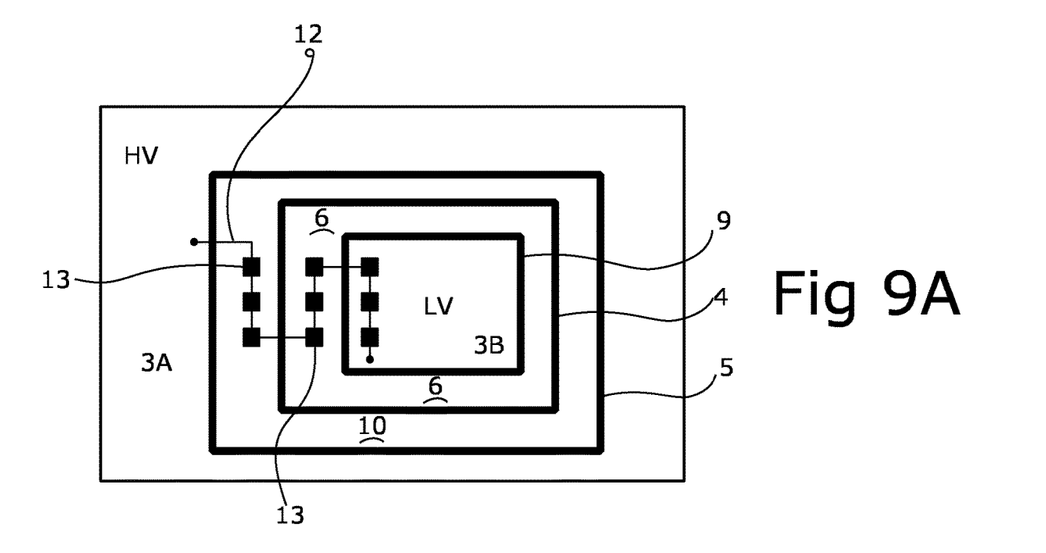
FIGS. 9A and 9B are plan view schematics illustrating variant spatial arrangements of diodes of the chain relative to the trenches.
Figure 9B:
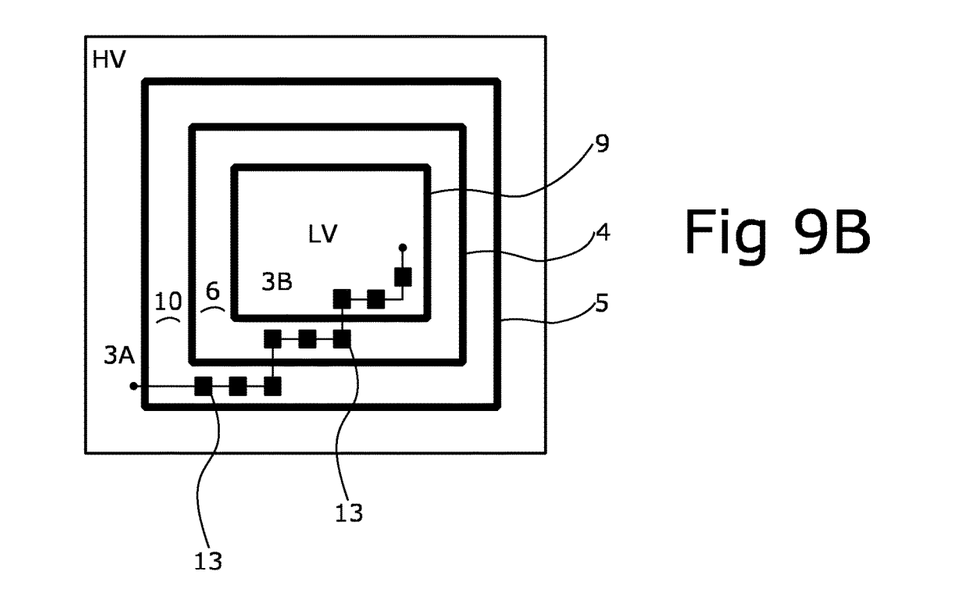

For ease of representation, the diode regions 15 illustrated in FIG. 8 are arranged abreast across the trenches 4, 5 though it is preferred that they are arranged in a line runs alongside the trenches 4, 5 (see FIGS. 9A and 9B).

A patterned insulator layer 16, e.g., of polysilicon deposited on the surface 3 defines windows to provide contact regions with each diode region 15, the high and low voltage regions HV LV, and the sub region 6. The insulator layer 16 is also arranged to extend across, and favorably fill, each of the trenches 4, 5.

On the insulator layer 16 is deposited a layer 17 of p-type polysilicon. The layer 17 is patterned to define portions 17A that contact the diode regions 15 through the windows of the insulator 16 to form diode junctions 18 that provide the reversed biased diodes 13.

The patterned layer 17 also defines portions 17B that provide the conductors of the circuit 12, connecting between adjacent n-type diode regions 15, and between the end n-type regions of the chain of diodes 13 and respective high and low voltage regions.

A consequence of the layer structure of FIG. 8 is the formation of additional, forward bias, diodes 19 that lie in series between pairs of reverse biased diodes 13 within the circuit 12. These provide an additional, albeit smaller, voltage drop.

Another consequence is the formation of parasitic diodes 20 formed through the junctions between each n-type diode region 15 and the sub-region 6. When in operation it is important that the sub-region 6 is at a lower voltage than either of the diode regions 15 that lie within it to ensure that the parasitic diodes 20 between the sub-region 6 and each n-type diode region 15 are reversed biased. This is achieved by positioning the node 14 at a point in the circuit lying immediately between the diodes that lie on either side of the trench 5.

It will be appreciated that the structure of FIG. 8 can be adapted to provide the circuits of FIGS. 5, 7 or described variants thereof.

Where used to implement the variant of FIG. 7, it is again desirable that the second-sub-region 10 is at a lower voltage than either of the diode regions 15 that lie within it. This can be achieved by positioning the node 14A at a point in the circuit lying immediately between the diodes that lie on either side of the trench 4.

It will be appreciated that the invention also has utility where layer types of the structure are reversed, i.e., layer 1 is p-type, layer 2 n-type, and diode regions 15 p-type. Where so it is desirable to make the n-type sub-regions 6, 10 at a higher voltage than the diode regions 15 to achieve the same effect. This could be achieved by repositioning the nodes 14 14A to the high voltage side of circuit relative the diodes 13 within the respective sub-region.

In a variant to FIG. 8, the conductor portions 17B could be provided by metal traces. Further the portions 17A may instead be comprised from thereby to form Schottky diodes.

FIGS. 9A and 9B are plan view schematics illustrating variant spatial arrangements of the diodes 13 of the circuit 12 of FIG. 7 that allow for a more compact guard structure.

The diodes 13 within each sub-region 6, 10 are arranged in a line that runs alongside the trenches 4, 5, 6 which in this embodiment are arranged in a nested formation around the low voltage region LV.

Expressed another way diodes 13 of the chain that lie between the same trenches are spaced apart along said trenches. This allows the spacing between the trenches 4, 5, 9 to be minimised reducing the overall space occupied by the guard structure.

Referring back to FIG. 8, the breakdown voltage of the parasitic diode 20 provides a limit on the total voltage drop that can be achieved within either the first or second sub-region 6, 10; the breakdown voltage of the parasitic diode 20 being likely smaller than the breakdown voltage of trenches 4, 5, 9. Where the voltage of the HV and LV regions is much larger that the breakdown voltage of the parasitic diodes 20, a large number of nested trenches is needed leading to a physically large guard ring structure. A solution to this problem is described in relation to FIG. 10.

Figure 10:
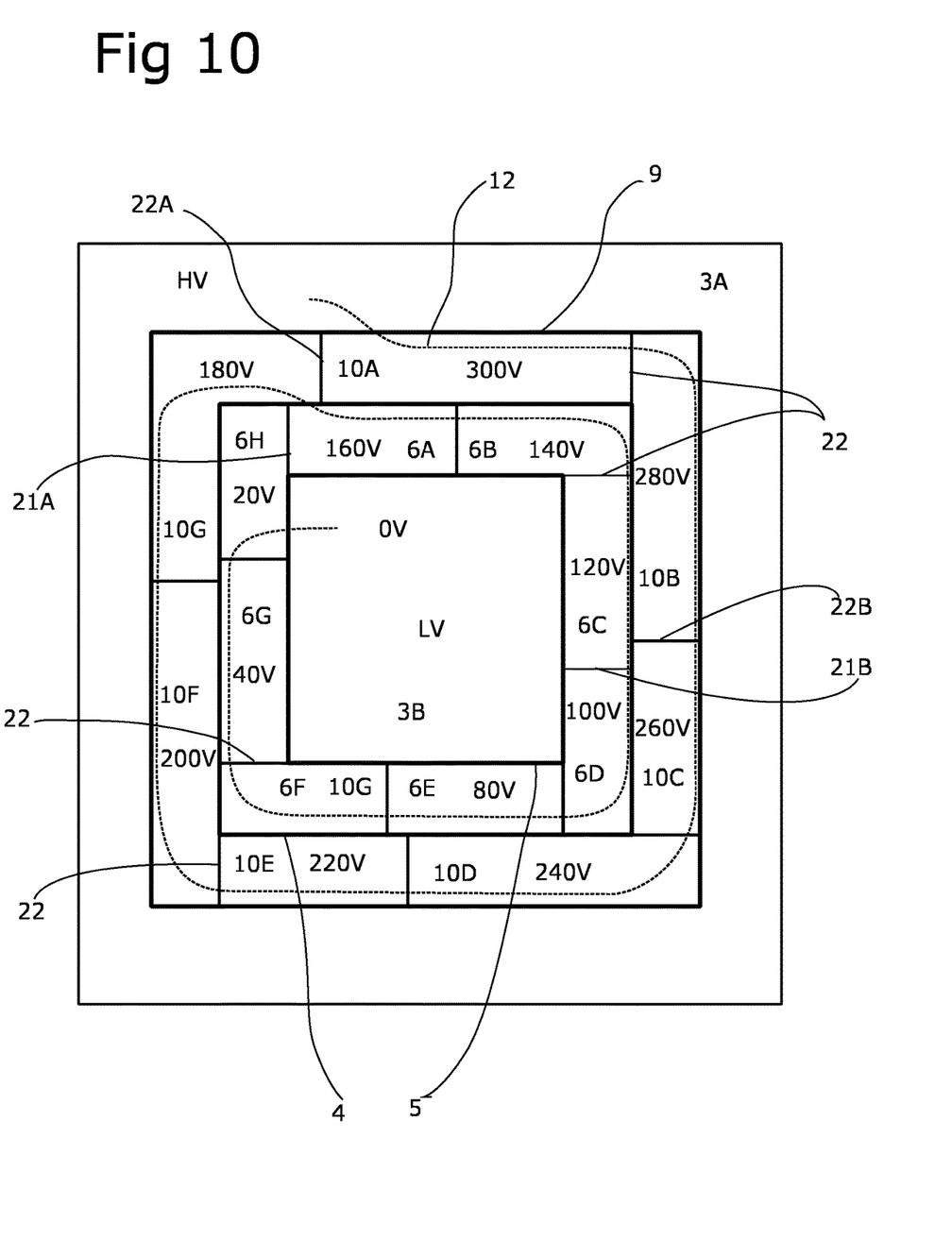
FIG. 10 is a plan view schematic illustrating an improved guard structure that can guard against a larger voltage drop for a given area compared with the structures of FIG. 8.

FIG. 10 is a plan view of a variant guard structure able to guard against larger voltage differentials compared with the arrangement of FIG. 9 for a given number of nested trenches.

The guard structure additionally comprises lateral trenches 21 22 that extend between adjacent nested trenches. A first set of lateral trenches 21 are spaced about and extend across the sub region 6 between the first and second trenches 4,5 dividing the sub region into separate divisions 6A-6H that are each isolated from the high and low voltage region and from each other.

A second set of lateral trenches 22 are spaced about and extend across the second sub region 10 between the first and third trenches 4, 9 to sub-divide the second sub-region 10 into separate divisions 10A-10G.

Each of lateral trenches 21 22, extends from the semiconductor surface 3 through the p-type layer 2 and into the n-type substrate 1. As such each subdivision comprises a portion of the semiconductor surface 3.

As before, circuit 12 (which is illustrated in FIG. 10 highly schematically as a dashed line) connects between the high voltage region HV and the low voltage region LV. The circuit 12 comprises multiple diodes 13 connected in series with at least one diode formed in each division 6A-6H, 10A-10G of each sub-region 6,10, and a separate node connected to each division 6A-6H, 10A-10G of each sub-region 6,10 so that a different intermediate voltage is applied to each division 6A-6H, 10A-10G.

Starting from the high voltage region HV the circuit 12 crosses the third trench 9 into the first division 10A of the second sub-region 10 where a first intermediate voltage is applied before crossing each of the lateral trench 22 to apply a sequentially smaller intermediate voltage to the remaining divisions 10B-10G. The circuit crosses the first trench 4 from the final division 10G of the second sub-region 10 into the first division 6A of the sub-region 6 where an intermediate voltage smaller than that applied to final division 10G is applied to first division 6A. The circuit 12 crosses each of the lateral trenches 21 to apply a sequentially smaller intermediate voltage to the remaining divisions 6B-6H of the sub-region 6 before crossing from the final division 6H of the sub-region 6 into the low voltage region LV.

FIG. 10 illustrates an example sequence of intermediate voltage values dropping from 300V to 20V in intervals of 20V. Achieving this with the structure of FIG. 8 w It will be appreciated that the HV and LV values will depend on application, fluctuate. The size of interval can be selected depending on the breakdown voltage of the parasitic diode 20.

The first set of lateral trenches 21 are offset relative to the second set lateral trenches 22 about the length of the first trench 4 such that there is no direct intersection of the first set of trenches 21 with the second set of trenches 22.

An example of this off setting is described in relation to trenches 21A and 22A which separate sub-regions 6A and 6H and 10A and 10G respectively, and trenches 21B and 22B which separate sub-regions 6C and 6D and 10B and 10C respectively.

The offset ensures that the high voltage sub-division in each of the respective groupings, i.e., subdivisions 10A and 10B are not contiguous with the lowest voltage subdivision of the grouping 6H 6D. As such this allows for a difference in voltage between these subdivisions that is greater than the breakdown voltage of the first trench 4.

Variants to the aforementioned embodiments are possible. For example, although a chain of (favorably Zener) diodes is preferred, the circuit 12 of may take other forms. For example, the circuit may comprise a chain of other electrical components (e.g., resistors) over which voltage is dropped. Alternatively, the circuit 12 may comprise one or more integrated circuits formed in one or more of the sub regions that provide the function of voltage regulators.

Although it is preferred that the p-type layer 2 is a polysilicon layer and additionally that it is formed through epitaxial deposition process, the layer 2 could alternatively be formed by doping the n-type layer 1.

In certain implementations the low voltage region may be subdivided by a further trench with the low voltage circuitry on one side of the further trench and the output connection of the circuit 12 at the low voltage region LV on the other side of the further trench. This provides additional isolation of the low voltage circuitry from the high voltage.

The Abstract is provided with the understanding that it is not intended be used to interpret or limit the scope or meaning of the claims. In addition, in the foregoing Detailed Description, various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

The corresponding structures, materials, acts, and equivalents of all means or step plus function elements in the claims below are intended to include any structure, material, or act for performing the function in combination with other claimed elements as specifically claimed. The description herein has been presented for purposes of illustration and description, but is not intended to be exhaustive or limited to the examples in the form disclosed. Many modifications and variations will be apparent to those of ordinary skill in the art without departing from the scope of the examples presented or claimed. The disclosed embodiments were chosen and described in order to explain the principles of the embodiments and the practical application, and to enable others of ordinary skill in the art to understand the various embodiments with various modifications as are suited to the particular use contemplated. It is intended that the appended claims below cover any and all such applications, modifications, and variations within the scope of the embodiments.

Although specific embodiments of the subject matter have been disclosed, those having ordinary skill in the art will understand that changes can be made to the specific embodiments without departing from the scope of the disclosed subject matter. The scope of the disclosure is not to be restricted, therefore, to the specific embodiments, and it is intended that the appended claims cover any and all such applications, modifications, and embodiments within the scope of the present disclosure.

What is claimed is:

1. A semiconductor device comprising:
 a guard structure for guarding a high voltage region at a semiconductor surface from a low voltage region at the semiconductor surface, the guard structure comprising:
  a first layer of a first type of semiconductor in contact with a second layer of a second type of semiconductor, the second layer providing the semiconductor surface;
  a first trench and a second trench lying between the high voltage region and the low voltage region to isolate the high voltage region from the low voltage region, each of the first trench and the second trench extending from the semiconductor surface and substantially entirely through the second layer to define therebetween a sub-region of the second layer between the high voltage region and the low voltage region, the sub-region being isolated from the high voltage region and the low voltage region; and
 the semiconductor device comprising a circuit that connects between the high voltage region and the low voltage region; the circuit arranged to generate an intermediate voltage; the circuit comprising an output connected to the sub-region for applying the intermediate voltage to the sub-region; the intermediate voltage having a value between a voltage of the respective high voltage region and a voltage of the low voltage region; and wherein the guard structure includes a first set of lateral trenches that extend between, and directly connect with, the first trench and the second trench across the sub-region to divide the sub-region into sub-divisions, and to isolate the sub-divisions from each other, and wherein the circuit comprises a separate output connected to each sub-division to apply a different intermediate voltage to each sub-division.

2. The semiconductor device according to claim 1, wherein the circuit is an integrated circuit.

3. The semiconductor device according to claim 1, wherein the circuit comprises an electrical component lying in the sub-region.

4. The semiconductor device according to claim 1, in which the circuit comprises a chain of electrical components in series to provide a series of voltage drops, and the output is connected between electrical components of the chain.

5. The semiconductor device according to claim 4, wherein the chain of electrical components is orientated to run alongside one or both of the first and second trenches.

6. The semiconductor device according to claim 3, wherein the electrical component comprises at least one diode.

7. The semiconductor device according to claim 6, wherein the at least one diode operates in a reverse biased condition.

8. The semiconductor device according to claim 7, in which the at least one diode is a Zener diode.

9. The semiconductor device according to claim 6, comprising:
a region of the first type of semiconductor within the second layer of the second type of semiconductor; and
a third layer lying on the semiconductor surface, the guard structure arranged such that a portion of the third layer is in contact with the region of the first type of semiconductor to form a diode junction to provide a first diode, and the portion of the third layer extends over the first trench to provide electrical connection between the first diode and the sub-region.

10. The semiconductor device according to claim 9, wherein the guard structure comprises a further region of the first type of semiconductor within the sub-region of the second layer, and the portion of the third layer is additionally in contact with the further region of the first type of semiconductor to define a second diode within the sub-region and to provide an electrical connection between the first diode and second diode.

11. The semiconductor device according to claim 9, wherein the guard structure comprises an oxide layer arranged between the semiconductor surface and the third layer, the oxide layer defining windows that define contact regions between the semiconductor surface and the third layer.

12. The semiconductor device according to claim 1, wherein the first trench and the second trench are arranged in a nested formation around the low voltage region or the high voltage region.

13. The semiconductor device according to claim 1, comprising:
a third trench lying between the high voltage region and the low voltage region to isolate the high voltage region from the low voltage region, the third trench extending from the semiconductor surface through the second layer and into the first layer to define between the third trench and the first trench, a second sub-region of the second layer between the high voltage region and the low voltage region, the second sub-region being isolated from the high voltage region and the low voltage region; and
a second circuit for applying a second intermediate voltage to the second sub-region of the second layer, the second intermediate voltage having a value between the intermediate voltage and the voltage of the high voltage region.

14. The semiconductor device according to claim 13, wherein the second circuit generates the second intermediate voltage, and the second circuit comprising a second output connected to the second sub-region for applying the second intermediate voltage to the second sub-region.

15. The semiconductor device according to claim 13, wherein the guard structure includes a second set of lateral trenches that extend across a second sub-region between the first trench and third trench to divide the second sub-region in sub-divisions, and to isolate the sub-divisions from each other; and
wherein the circuit also comprises a separate output connected to each sub-division of the second sub-region in order to apply a different intermediate voltage to each sub-division of the second sub-region.

16. A semiconductor device comprising:
a guard structure for guarding a high voltage region at a semiconductor surface from a low voltage region at the semiconductor surface, the guard structure comprising:
a first layer of a first type of semiconductor in contact with a second layer of a second type of semiconductor, the second layer providing the semiconductor surface;
a first trench and a second trench lying between the high voltage region and the low voltage region to isolate the high voltage region from the low voltage region, each of the first trench and second trench extending from the semiconductor surface and substantially entirely through the second layer to define therebetween a sub-region of the second layer between the high voltage region and the low voltage region, the sub-region being isolated from the high voltage region and the low voltage region; and
the semiconductor device comprising a circuit that connects between the high voltage region and the low voltage region; the circuit arranged to generate the intermediate voltage; the circuit comprising an output connected to the sub-region for applying the intermediate voltage to the sub-region; the intermediate voltage having a value between the voltages of the respective high voltage region and low voltage region; and wherein the guard structure includes a first set of lateral trenches that extend between, and directly connect with, the first trench and the second trench across the sub-region to divide the sub-region into non-nested sub-divisions, and to isolate the sub-divisions from each other, and wherein the circuit comprises a separate output connected to each non-nested sub-division to apply a different intermediate voltage to each non-nested sub-division.

17. A semiconductor device comprising:
a guard structure for guarding a high voltage region at a semiconductor surface from a low voltage region at the semiconductor surface, the guard structure comprising:
a first layer of a first type of semiconductor in contact with a second layer of a second type of semiconductor, the second layer providing the semiconductor surface;
a first trench, a second trench, and a third trench, forming a set of three nested trenches adjacent to each other, lying between the high voltage region and the low voltage region to isolate the high voltage region from the low voltage region, each of the first trench, second trench, and third trench, extending from the semiconductor surface and substantially entirely through the second layer thereby forming a first sub-region, between the first trench and the second trench, and a second sub-region between the second trench and the third trench, both the first sub-region and the second sub-region being between, and isolated from, the high voltage region and the low voltage region, and further isolated from each other; and
the semiconductor device comprising a circuit that connects between the high voltage region and the low voltage region; the circuit arranged to generate a first intermediate voltage and a second intermediate voltage; the circuit comprising a first output connected to the first sub-region for applying the first intermediate voltage to the first sub-region, and a second output connected to the second sub-region for applying the second intermediate voltage to the second sub-region; the first intermediate voltage having a value between the voltages of the respective high voltage region and the second intermediate region, and the second intermediate voltage having a value between the voltages of the respective the first sub-region and the low voltage region; and wherein the guard structure includes
- a first set of lateral trenches that extend between, and directly connect with, the first trench and the second trench across the first sub-region to divide the first sub-region into non-nested sub-divisions, and to isolate the sub-divisions from each other, and
- a second set of lateral trenches that extend between, and directly connect with, the second trench and the third trench across the second sub-region to divide the second sub-region into non-nested sub-divisions, and to isolate the sub-divisions from each other; and
- wherein the first set of lateral trenches are offset relative to the second set of lateral trenches about the length of the second trench such that there is no direct intersection of the second trench by the first set of lateral trenches with the second set of lateral trenches; and
- wherein the circuit comprises a separate output connected to each non-nested sub-division to apply a different intermediate voltage to each non-nested sub-division.

* * * * *